United States Patent
Sakamoto (10) Patent No.: US 6,320,407 B1
(45) Date of Patent: Nov. 20, 2001

(54) SEMICONDUCTOR CIRCUIT HAVING OUTPUT CIRCUIT WHOSE SLEW RATE CAN BE ADJUSTED, APPARATUS AND METHOD FOR AUTOMATICALLY ADJUSTING SLEW RATE OF OUTPUT CIRCUIT IN SEMICONDUCTOR CIRCUIT

(75) Inventor: Fumihiko Sakamoto, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/686,986

(22) Filed: Oct. 17, 2000

(30) Foreign Application Priority Data

Oct. 18, 1999 (JP) .................................................. 11-295755

(51) Int. Cl.[7] .............................................. H03K 19/0185
(52) U.S. Cl. .................................. 326/27; 326/87; 326/83
(58) Field of Search ................................. 326/26–28, 83, 326/86, 87

(56) References Cited

U.S. PATENT DOCUMENTS 5,528,166 * 6/1996 Iikabahar ................................ 326/27
5,877,647 * 3/1999 Vajapey et al. ........................ 326/87
5,898,321 * 4/1999 Iekbahar et al. ...................... 326/87
5,917,758 * 6/1999 Keeth ..................................... 326/87

FOREIGN PATENT DOCUMENTS 8-97693   4/1996   (JP) .

\* cited by examiner

*Primary Examiner*—Michael Tokar
*Assistant Examiner*—Don Phu Le
(74) *Attorney, Agent, or Firm*—Sughrue, Mion, Zinn, Macpeak & Seas, PLLC (57) ABSTRACT

A high-level signal is sent to a mode control terminal, a pulse for slew-rate adjustment is sent to a replicated gate, and the slew rate at a measurement terminal is set to a desired value using a switch unit. The slew rate of the replicated gate having the same structure as the structure of output circuits and being formed on the same semiconductor substrate is set based on digital signal which are generated upon operation of the switch unit. The slew rate of output circuits is so adjusted as to be the same as the slew rate of the replicated gate.

14 Claims, 8 Drawing Sheets

SEMICONDUCTOR CIRCUIT HAVING OUTPUT CIRCUIT WHOSE SLEW RATE CAN BE ADJUSTED, APPARATUS AND METHOD FOR AUTOMATICALLY ADJUSTING SLEW RATE OF OUTPUT CIRCUIT IN SEMICONDUCTOR CIRCUIT

BACKGROUND OF THE INVENTION

1. Field of the Invention

The present invention relates to a semiconductor circuit, such as a data transmission circuit, etc. having an output circuit whose slew rate can be adjusted, a method for adjusting a slew rate of the semiconductor circuit, and an apparatus for automatically adjusting the slew rate of the output circuit.

2. Description of the Related Art

In a semiconductor circuit such as a data transmission circuit or the like, in order to achieve data transmission at high speed while decreasing data transmission cycles time, it is desired to increase the slew rate of an output signal from an output circuit forming an output stage of the data transmission circuit. If the slew rate is increased, the transmission waveform will not be satisfactory, due to an effect of frequency characteristics of a data transmission medium. Accordingly, in order to achieve both the high-speed data transmission and appropriately controlling of the transmission waveform, the data transmission circuit needs to be designed such that the slew rate of an output signal from its output circuit remains within a predetermined range of values.

Even if the data transmission circuit is thus designed, the slew rate of the output signal may not desirably be obtained, depending on the state of the manufactured output circuit or its usage period. In order to overcome this problem, there is disclosed a technique regarding an output buffer compensation circuit in Unexamined Japanese Patent Application KOKAI Publication No. H8-97693.

The disclosed circuit detects at least the current driving capacity of a semiconductor device included in an internal circuit P2, using a ring oscillator which is formed on a substrate P3 on which the semiconductor device is formed. In accordance with this resultant detection, a variable resistance value of a variable resistance element forming an output buffer is controlled so as to compensate for the slew rate of the semiconductor device. While compensating for the slew rate, a controlling signal generated using a counter or two D/A converters is used, and an MOS transistor is employed as a variable resistance element.

In the output buffer compensation circuit disclosed in the publication, the current driving capacity of the semiconductor device in the internal circuit P2 is detected using the ring oscillator. The detection of the current driving capacity of how much current can flow is detection of the resistance value according to Ohm's law, i.e., I=V/R. Accordingly, in the disclosed circuit, the slew rate compensation is performed by detecting the current driving capacity. In such a structure, if the same type of transistor as that included in the internal circuit or the ring oscillator is employed in the output buffer, it can be expected that slew rate compensation is achieved in the structure where the resistance of the transistor in the output buffer varies.

The slew rate can be obtained based on a time constant which is a product of a resistance value and parasitic capacitance in the output buffer. Thus, the accurate slew rate of the output buffer can not entirely be adjusted in a circuit having the structure where the parasitic capacitance has an effect. According to the disclosed technique, at least two D/A converters for generating a controlling signal for slew rate adjustment are necessary. In this structure, in order to maintain the accuracy of the D/A converters and to appropriately set a desired variable resistance value, the size of the compensation circuit is unwantedly increased and a complicated technique needs to be developed for manufacturing a compensation circuit.

SUMMARY OF THE INVENTION

The present invention has been made in consideration of the above problems. It is accordingly an object of the present invention to provide a semiconductor circuit having an output circuit whose slew rate can appropriately be adjusted and set to a desired value with high accuracy, and a method for adjusting a slew rate of the output circuit without any complicated process.

Another object thereof is to provide an apparatus for automatically adjusting a slew rate of an output circuit which is included in a semiconductor circuit.

In order to achieve the above objects, according to the first aspect of the present invention, there is provided a semiconductor circuit including an output circuit whose slew rate can be adjusted and which outputs a signal, sent form an internal circuit, said semiconductor circuit comprising:

at least one output circuit which outputs a signal sent from an internal circuit externally, and whose slew rate is adjusted in response to a setting signal;

a replicated output circuit which has a same structure as a structure of the output circuit, receives a pulse signal and outputs the pulse signal, and whose slew rate is adjusted in response to the setting signal;

a pulse signal supplier for slew rate adjustment which supplies the replicated output circuit with the pulse signal for slew rate adjustment; and a setting signal supplier which supplies the setting signal for setting a slew rate of the output circuit and the replicated output circuit.

In the structure, the slew rate of the replicated output circuit can be set by tuning the setting signal while observing the pulse signal output form the replicated output circuit. The slew rate of the output circuit is adjusted to be substantially same as the slew rate of the replicated output circuit.

According to this invention, having set the slew rate of the replicated output circuit, the setting of the slew rate of the output circuit can be easily completed. In addition, because the replicated output circuit has the same structure as that of the output circuit, no special or complicated technique for manufacturing the semiconductor circuit is necessary. The replicated output circuit and the output circuits are to have different levels of manufacturing accuracy and different amounts of parasitic capacity between the two. However, according to the structure of the present invention, the output circuits and the replicated output circuit have the same structures and desirably are formed on the same semiconductor substrate, thus the manufacturing accuracy and the parasitic capacity are the same between the two. Therefore, having set the slew rate of the replicated gate, the slew rate of the output circuits can be adjusted with high accuracy.

The pulse signal supplier may comprise a pulse generator which generates the pulse signal and supplies the pulse signal to the replicated output circuit or a pulse supplying terminal through which the pulse signal is supplied to the replicated output circuit.

In the structure, the pulse signal supplied is supplied from the pulse signal supplier, and the slew rate of the replicated output circuit is set. Then, the slew rate of the replicated output circuit is set based on the setting signal from the setting unit. The slew rate of the output circuit is adjusted to be substantially same as the slew rate of the replicated output circuit.

In the above-structured semiconductor circuit, the slew rate of the replicated output circuit can be set by varying resistance of the replicated circuit based on received setting signals, and the setting signal supplier supplies the setting signal comprised of digital signals generated upon operations of switches. In this structure, the replicated output circuit receives the digital signals generated upon operations of switches. The slew rate of the replicated output circuit can be set by varying, for example, resistance of the replicated output circuit based on the received digital signals, thus realizing easy slew rate adjustment by operating the switches.

According to the second aspect of the present invention, there is provided a method for adjusting the slew rate of the output circuit included in the above semiconductor circuit, the method comprising:

controlling the pulse signal supplier to supply the replicated output circuit with a pulse signal having a predetermined frequency; and controlling the setting signal supplier to set the slew rate of the replicated output circuit by the setting signal while observing an output signal of the replicated output circuit.

According to this method, having set the slew rate of the replicated output circuit, the adjusting of the slew rate of the output circuit can easily be completed. In addition, because the replicated output circuit has the same structure as that of the output circuit, no special or complicated technique for manufacturing the semiconductor circuit is necessary. The replicated output circuit and the output circuits are to have different levels of manufacturing accuracy and different amounts of parasitic capacity between the two. However, according to the structure of the present invention, the output circuits and the replicated output circuit have the same structures and are formed on the same semiconductor substrate, thus the manufacturing accuracy and the parasitic capacity are the same between the two. Therefore, having set the slew rate of the replicated gate, the slew rate of the output circuits can be adjusted with high accuracy.

According to the third aspect of the present invention, there is provided a circuit comprising:

an output circuit whose slew rate can be adjusted based on a setting signal and which outputs a signal from an internal circuit to an external circuit;

a replicated gate which has a same structure as a structure of the output circuit and whose slew rate can be adjusted based on a setting signal;

a pulse signal supplier which supplies the replicated gate with a pulse signal;

a supplier which supplies a set of digital signals which are a unique set according to a predetermined patter in order to set the slew rate of the replicated gate; and a memory which stores in a non-volatile manner the setting signal, by which an adequate slew rate of the replicated gate is obtained, the memory outputting the stored setting signal to the output circuit.

According to this structure, while observing the slew rate of the replicated gate, the unique set of digital signal according to a predetermined pattern are supplied from the supplier, and the setting signal by which an adequate slew rate of the replicated gate can be obtained is stored. Based on the stored setting signal, the slew rate of the output circuit can be adjusted.

According to the fourth aspect of the present invention, there is provided an automatic slew-rate adjustment apparatus which automatically adjusts the slew rate of the output circuit included in the above-structured circuit, the apparatus comprising:

an observing device which observes a signal from said replicated gate; and a controlling device which controls adjustment of the slew rate of the output circuit, and wherein said controlling device
controls said pulse signal supplier to supply said replicated gate with a signal,
controls said digital signal supplier to switchingly supply the digital signal in accordance with a predetermined pattern, and determines one or more digital signals when said observing device detects a desired slew rate of said replicated gate, and
writes the determined one or more digital signals in said memory.

According to this structure, the slew rate of the circuit can be adjusted automatically.

According to the fifth aspect of the present invention, there is provided a semiconductor circuit including an output circuit whose slew rate can be adjusted and which outputs a signal, from an internal circuit, externally from a semiconductor substrate, said semiconductor circuit comprising:

a replicated gate which has a same structure as a structure of the output circuit and is arranged on a semiconductor substrate on which the output circuit is arranged;

a measurement terminal through which a signal from said replicated gate is output;

a pulse supplier for slew rate adjustment which supplies said replicated gate with a pulse signal for slew rate adjustment;

a digital signal suppler which supplies a set of digital signals which are set according to a predetermined patter, in order to set the slew rate of said replicated gate; and a memory which stores in a non-volatile manner one or more digital signals for setting the slew rate of said replicated gate to a desired value, of the set of digital signals set according to a predetermined pattern.

According to the sixth aspect of the present invention, there is provided an automatic slew-rate adjustment apparatus which automatically adjusts the slew rate of the output circuit included in the above-structured circuit, the apparatus comprising:

an observing device which observes a signal from said measurement terminal; and a controlling device which controls adjustment of the slew rate of said replicated gate, and wherein said controlling device
controls said pulse signal supplier to supply said replicated gate with a pulse signal,
controls said digital signal supplier to switchingly supply digital signals in accordance with a predetermined pattern, and determines one or more digital signals by which the observing device observes the signal from said replicated gate satisfies predetermined characteristics, and
writes the determined digital signals in said memory.

The controlling device may carry out a process for taking statistics of time periods required for automatically adjusting the slew rate of said replicated gate, and controls an output stage to output a result of the process.

According to the seventh aspect of the present invention, there is provided a circuit comprising:

an output circuit which outputs a supplied signal, and whose slew rate can be adjusted in response to a setting signal;

a replicated output circuit which receives a pulse signal and outputs a pulse signal and whose slew rate can be adjusted in response to the setting signal;

a pulse signal supplier which supplies said replicated output circuit with a pulse signal; and a setting signal supplier which supplies the setting signal to said output circuit and said replicated output circuit.

According to the eighth aspect of the present invention, there is provided a method of adjusting the slew rate of the output circuit included in the above mentioned circuit, comprising, supplying a pulse signal with a desired frequency to the replicated output circuit from said pulse signal supplier;

supplying a setting signal to said replicated output circuit while observing the output signal of said replicated output circuit, and supplying to said output circuit with a setting signal which is output when it is observed that the output signal of said replicated output circuit satisfies a predetermined characteristics.

The setting signals supplied to said output circuit and said replicated output circuit may be substantially same as each other.

The setting signal supplied to said replicated output circuit, which is output when it is observed that the output signal of said replicated output circuit satisfies a predetermined characteristics, may be stored in a memory, the stored setting signal is supplied to said output circuit.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

Preferred embodiments of the present invention will now be explained with reference to the accompanying drawings.

First Embodiment

Figure 1:
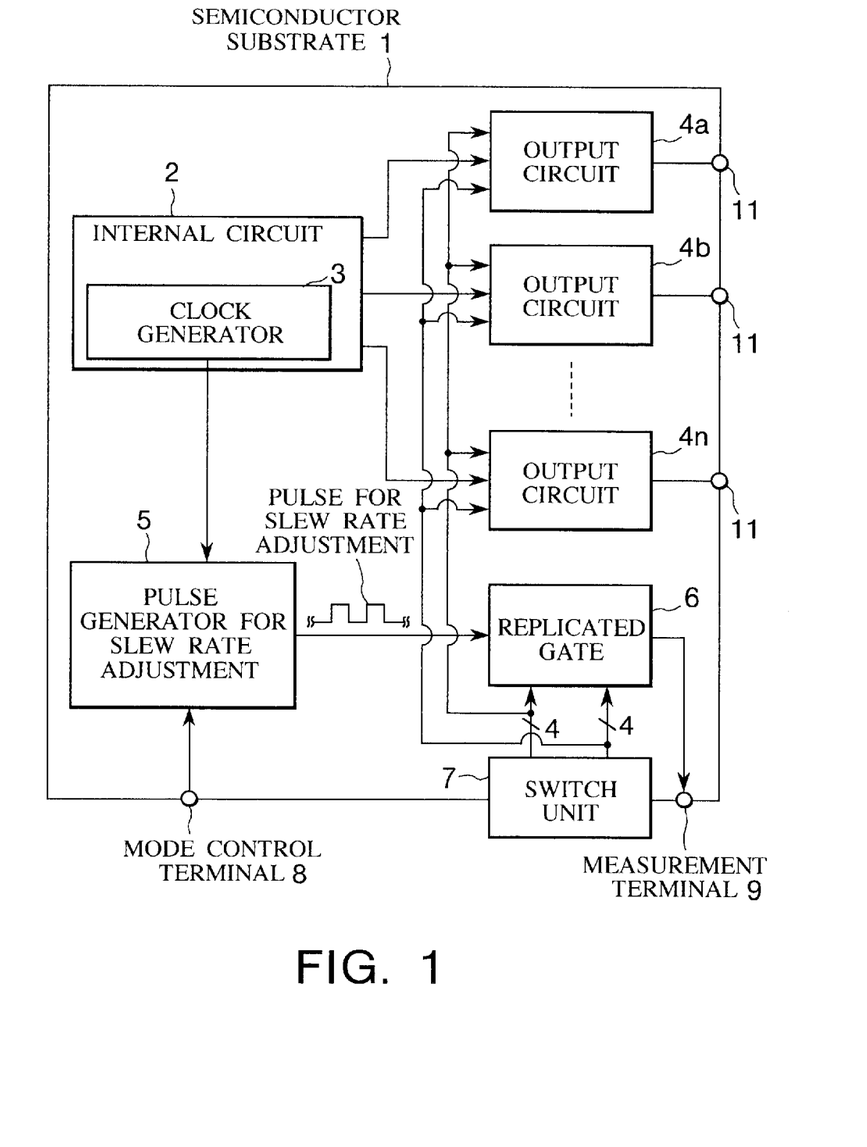
FIG. 1 is a block diagram showing the structure of a semiconductor circuit according to the first embodiment.

FIG. 1 is a block diagram showing the structure of a semiconductor circuit according to the first embodiment. This semiconductor circuit comprises an internal circuit 2, output circuits 4a, 4b, . . . 4n whose slew rate can be adjusted, a replicated gate 6, a pulse generator 5 for slew rate adjustment, and a switch unit 7.

The internal circuit 2 includes a clock generator, 3 which supplies a predetermined section within the semiconductor circuit with a clock signal, and is prepared for realizing a predetermined function for data transmission, etc. The replicated gate 6 has the same structure as that of the output circuits 4a, 4b, . . . , 4n . The pulse generator 5 for slew rate adjustment supplies the replicated gate 6 with predetermined cycle(s) of a pulse for slew rate adjustment which is rectangular in shape, when it receives a clock signal from the clock generator 3 and a slew rate adjustment mode is specified. The switch unit 7 is prepared for setting a slew rate of the replicated gate 6. In this structure, the output circuits 4a, 4b, . . . 4n and the replicated gate 6 are formed on the same semiconductor substrate 1.

The semiconductor circuit according to the first embodiment includes output terminals 11, a measurement terminal 9, and a mode control terminal 8. The output terminals 9 are prepared for outputting signals, transmitted from the output circuits 4a, 4b, . . . 4n, respectively, externally from the semiconductor substrate. The measurement terminal 9 is to measures a slew rate of the replicated gate 6. The mode control terminal 8 provides the pulse generator 5 for slew rate adjustment with a mode controlling signal. In this embodiment, the semiconductor circuit includes a plurality of output circuits. However, the semiconductor circuit may arbitrarily include at least one or more output circuits. In addition, the semiconductor circuit may include an input terminal for inputting a signal from another semiconductor circuit to the front stage of the internal circuit 2.

Figure 2:
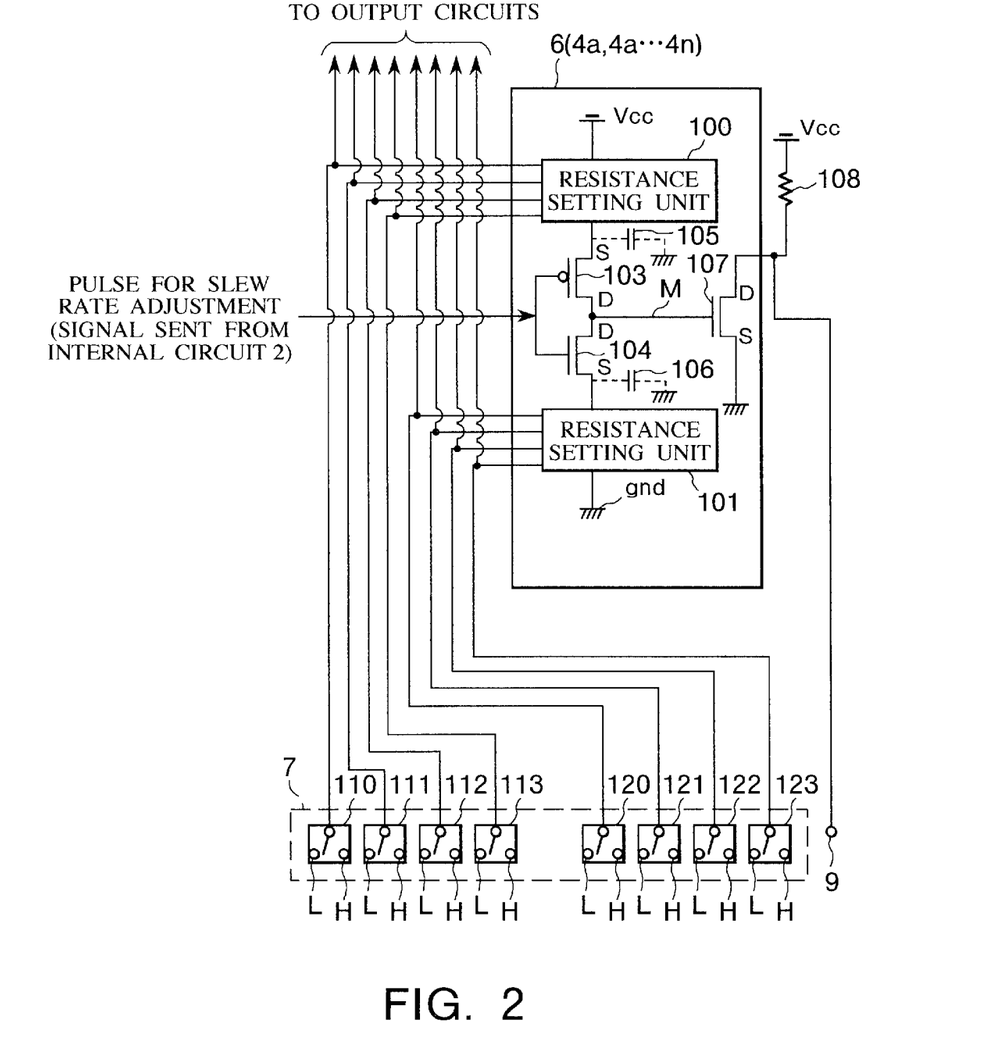
FIG. 2 is a circuitry diagram showing the structure of a replicated gate and its peripheral sections.

FIG. 2 is a circuitry diagram showing the structure of the replicated gate 6 and its peripheral sections.

One of the features of the present invention is that the structure of the replicated gate 6 is the same as that of the output circuits 4a, 4b, . . . 4n and that the replicated gate 6 and the output circuits 4a, 4b, . . . 4n are formed on the same semiconductor substrate. For easy understanding of this feature, in FIG. 2, the reference numeral "6" is followed by the subsidiary reference numerals (4a, 4b, . . . 4n ). Instead of explaining both the replicated gate 6 and the output circuits 4a, 4b, . . . 4n, explanations will be made only to the internal structure of the replicated gate 6 below.

The replicated gate 6 includes a C-MOS circuit, a resistance setting unit 100, a resistance setting unit 101, and an N-type MOS transistor 107.

The C-MOS circuit connects a P-type MOS transistor 103 with an N-type MOS transistor 104. The resistance setting unit 100 is arranged between a source terminal of the P-type MOS transistor 103 and a source line (Vcc). The resistance setting unit 101 is arranged between a source terminal of the N-type MOS transistor 104 and a ground line (gnd). The N-type MOS transistor 108 inputs an output signal of the C-MOS circuit to the gate terminal of the N-type MOS transistor 108, and connects the drain terminal of the C-MOS circuit to another source line (Vcc). The drain terminal of the N-type MOS transistor 107 is connected to the measurement terminal 9.

A pulse for slew rate adjustment is input to the commonly-connected gates of both transistors 103 and 104 forming the C-MOS circuit, in the case where the circuit shown in FIG. 2 is the replicated gate 6. On the other hand, a signal from the internal circuit 2 is input to the commonly-connected gates of both transistors 103 and 104, in the case where the circuit shown in FIG. 2 is either one of the output circuits 4a, 4b, . . . , 4n in FIG. 2. In addition, in the case of one of the output circuits 4a, 4b, . . . , 4n, a corresponding one of the output terminals 11 is connected to the drain terminal of the N-type MOS transistor 107.

The switch unit 7 is composed of eight operational switches 110 to 113 and 120 to 123. Those operational switches can be realized using, for example, a dip-switch or a spring-shant. When one who is in charge of operating the operational switches, operates either one of the operational switches at a time, a voltage level of a signal line corresponding to the operated operational switch is set either to a high level "H" or a low level "L". Four signal lines respectively connected to the operational switches 110, 111, 112, and 113 are connected to the resistance setting unit 100 in the replicated gate 6. Four signal lines respectively connected to the operational switches 120, 121, 122, and 123 are connected to the resistance setting unit 101 in the replicated gate 6. A capacitive element denoted with a reference numeral 105 includes a resistance value set by the resistance setting unit 100, and parasitic capacitance which has an effect on a slew rate of the replicated gate 6 at the trailing edge of an output signal therefrom. Similarly, a capacitive element denoted with a reference numeral 106 includes a resistance value set by the resistance setting unit 101, and parasitic capacitance which has an effect on a slew rate of the replicated gate 6 at the leading edge of an output signal therefrom.

Figure 3:
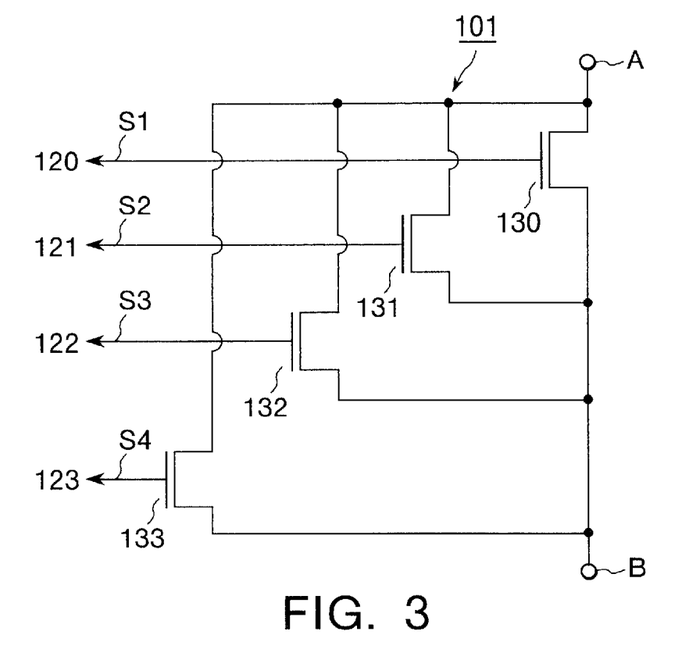
FIG. 3 is a circuitry diagram showing the internal structure of a resistance setting unit.

FIG. 3 is an internal circuitry diagram showing the structure of the resistance setting unit 101. The resistance setting unit 101 includes four N-type MOS transistors 130, 131, 132, and 133 which are connected in parallel with each other. The gate terminals of the N-type MOS transistors 130, 131, 132, and 133 are connected to signal lines S1, S2, S3 and S4, respectively. The signal lines S1, S2, S3, and S4 are connected to the operational switches 120, 121, 122, and 123, respectively. Based on digital signals (1=high level "H", 0=low level "L") over the respective signal lines S1, S2, S3, and S4, the resistance value between the terminals A–B in the illustration can be changed. For example, in the case where the digital signals over the signal lines S1, S2, S3, S4 are "1000", only the N-type MOS transistor 130 is ON. Note that the resistance value between the terminals A–B is represented with a reference symbol "R" in this specification. The resistance value between the terminals A–B can be represented as "R/2", in the case where the signals over the signal lines S1, S2, S3, S4 are "1100". The resistance value therebetween is "R/3", in the case where the signals over the signal lines S1, S2, S3, S4 are "1110". Further, the resistance value therebetween is "R/4", in the case where the signals over the signal lines S1, S2, S3, S4 are "1111". Accordingly, upon operation of the operational switches 120 to 123, the resistance value set by the resistance setting unit 101 can be changed. This achieves the adjustment of the slew rate of the replicated gate 6 at the leading edge of the output signal.

Figure 4:
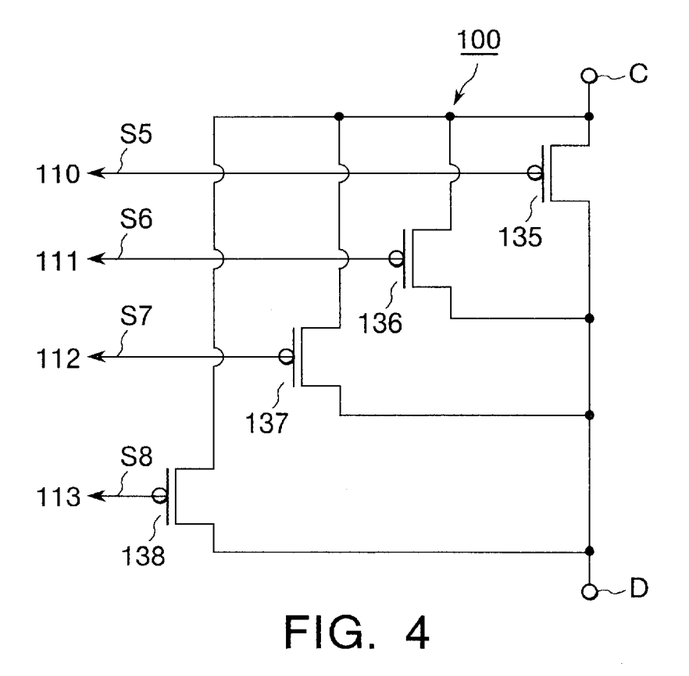
FIG. 4 is a circuitry diagram showing the internal structure of a resistance setting unit.

FIG. 4 is a circuitry diagram showing the internal structure of the resistance setting unit 100. This resistance setting unit 100 includes four P-type MOS transistors 135, 136, 137, and 138 which are connected in parallel with each other. The gate terminals of the P-type MOS transistors 135, 136, 137 and 138 are connected to signals lines S5, S6, S7, and S8, respectively. The signal lines S5, S6, S7, and S8 are those connected to the operational switches 110, 111, 112, and 113, respectively. Based on digital signals (1=high level "H", 0=low level "L") over the respective signal lines S5, S6, S7, and S8, the resistance values between the terminals C–D in the illustration can be changed. For example, in the case where the digital signals over the signal lines S5, S6, S7, S8 are "1000", only the N-type MOS transistor 135 is ON. The resistance value between the terminals C–D can be represented as "R/2", in the case where the digital signals over the signal lines S5, S6, S7 and S8 are "1100". The resistance value therebetween is "R/3", in the case where the signals over the signal lines S5, S6, S7 and S8 are "1110". Further, the resistance value therebetween is "R/4", in the case where the signals over the signal lines S5, S6, S7 and S8 are "1111". Accordingly, upon operation of the operational switches 110 to 113, the resistance value set by the resistance setting unit 100 can be changed. This achieves the adjustment of the slew rate of the replicated gate 6 at the trailing edge of the output signal.

Suppose that the resistance values are set both by the resistance setting units 100 and 101. Explanations will more specifically be made to operations of the replicated gate 6, with reference to FIG. 2, to facilitate understanding of this invention. In the case where a leading edge signal is input to the replicated gate 6, the P-type MOS transistor 103 is OFF, and the N-type MOS transistor 104 is ON. At this time, a voltage at a node M decreases, resulting in that the N-type MOS transistor 107 is OFF and a voltage at the measurement terminal 9 is at a high level (a leading edge signal of the replicated gate 6). This is done by a time constant which is a product of the resistance value set by the resistance setting unit 101 and the parasitic capacitance 106.

On the contrary, in the case where a trailing edge signal is input to the replicated gate 6, the P-type MOS transistor 103 is ON, and the N-type MOS transistor 104 is OFF. At this time, a voltage at the node M increases, resulting in that the N-type MOS transistor 107 is ON and a voltage at the measurement terminal 9 is at a low level (trailing edge signal of the replicated gate 6). This is done by a time constant which is a product of the resistance value set by the resistance setting unit 100 and the parasitic capacitance 105.

Figure 5:
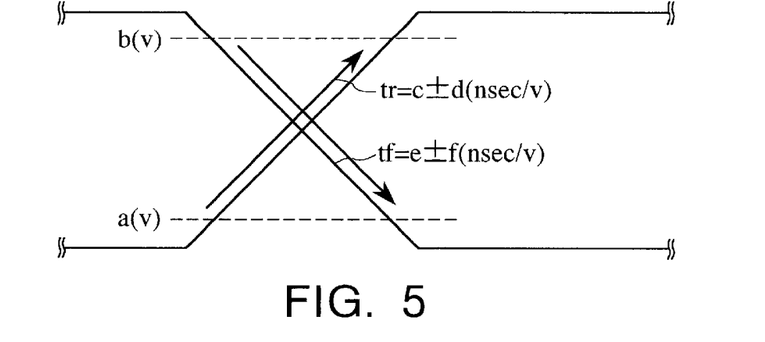
FIG. 5 is an explanatory diagram for explaining a slew rate of the replicated gate which is measured using a waveform measurement unit.

Accordingly, the replicated gate 6 receives the digital signals which are generated upon operation of the operational switches 110 to 113 and 120 to 123. The slew rate of the replicated gate 6 can be adjusted based on the received digital signals. In other words, the slew rate thereof can easily be adjusted upon operation of the operational switches. As illustrated in FIG. 5, for example, a rise time TR during which the leading edge increases from a pulse level A(V) to a pulse level B(V), and a decay time TF during which the trailing edge decreases from the pulse level B(V) to the pulse level A(V), are equal to (c±d(nsec/v)) and (e±f(nsec/v)), respectively. If the rise time TR and the decay time TF are equal to (c±d(nsec/v)) and (e±f(nsec/v)), respectively, the slew rate of the replicated gate 6 can be assumed to be a desired value. After this, adjustment of the slew rate of the output circuits 4a, 4b, . . . , 4n is to be carried out.

Explanations will now be made to a method for adjusting a slew rate of each of the output circuits 4a, 4b, . . . 4n included in the semiconductor circuit illustrated in FIG. 1. The one who is in charge of slew rate adjustment provides the mode control terminal 8 with a high level signal. After this, the pulse generator 5 for slew rate adjustment supplies the replicated gate 6 with a pulse for slew rate adjustment. The slew rat of the replicated gate 6 is measured, using a wave-form measurement (observe) unit, such as an oscilloscope, etc., through the measurement terminal 9. Then, it is determined whether the resultant measurement satisfies the characteristics of the slew rate shown in FIG. 5.

In the case where the resultant measurement does not satisfy the characteristics, the one who is in charge of slew rate adjustment operates the operational switches 110 to 113 and 120 to 123. Particularly, until the slew rate of the replicated gate 6 which is measured through the measurement terminal 9 satisfies the characteristics of FIG. 5, an operation for setting the voltage level of a voltage of the signal lines connected to their corresponding operational switches from a high to low level and vice versa is repeated. In the case where the resultant measurement satisfies the characteristics after the operation for setting the voltage level, the slew rate of the replicated gate 6 is completely set. At this time, signals for setting the same resistance value as that of the replicated gate 6 are supplied both to the resistance setting units 100 and 101 in each of the output circuits 4a, 4b, . . . , 4n . Hence, the slew rate of each of the output circuits 4a, 4b, . . . , 4n is adjusted as to be the same as the slew rate setting value of the replicated gate 6.

According to this embodiment, a high level signal is transmitted to the mode control terminal 8. A pulse for slew rate adjustment is sent to the replicated gate 6. The slew rate at the measurement terminal 9 is set to a predetermined value using the operational switches 110 to 113 and 120 to 123. The slew rate of the replicated gate 6 is set based on digital signals generated upon operation of the operational switches 110 to 113 and 120 to 123. Then, the slew rate of each of the output circuits 4a, 4b, . . . , 4n is adjusted as to be the same as that of the replicated gate 6.

According to this embodiment of the present invention, having set the slew rate of the replicated gate 6, the slew rate adjustment of the output circuits 4a, 4b, . . . , 4n can easily be completed. Besides, the replicated gate 6 has the same structure as the structure of each of the output circuits 4a, 4b, . . . , 4n, thus no complicated technique for manufacturing the semiconductor circuit is required. Normally, the replicated gate 6 and the output circuits 4a, 4b, . . . , 4n are to have different levels of manufacturing accuracy and different amounts of parasitic capacity between the two. However, according to the structure of the present invention, the output circuits and the replicated gate have the same structures and are formed on the same semiconductor substrate, thus the manufacturing accuracy and the parasitic capacity are the same between the two. Therefore, having set the slew rate of the replicated gate, the slew rate of the output circuits can be adjusted with high accuracy.

Second Embodiment

One of the features of the second embodiment is that a pulse for slew rate adjustment is directly supplied to the replicated gate 6 so as to adjust the slew rate of the replicated gate 6.

Figure 6:
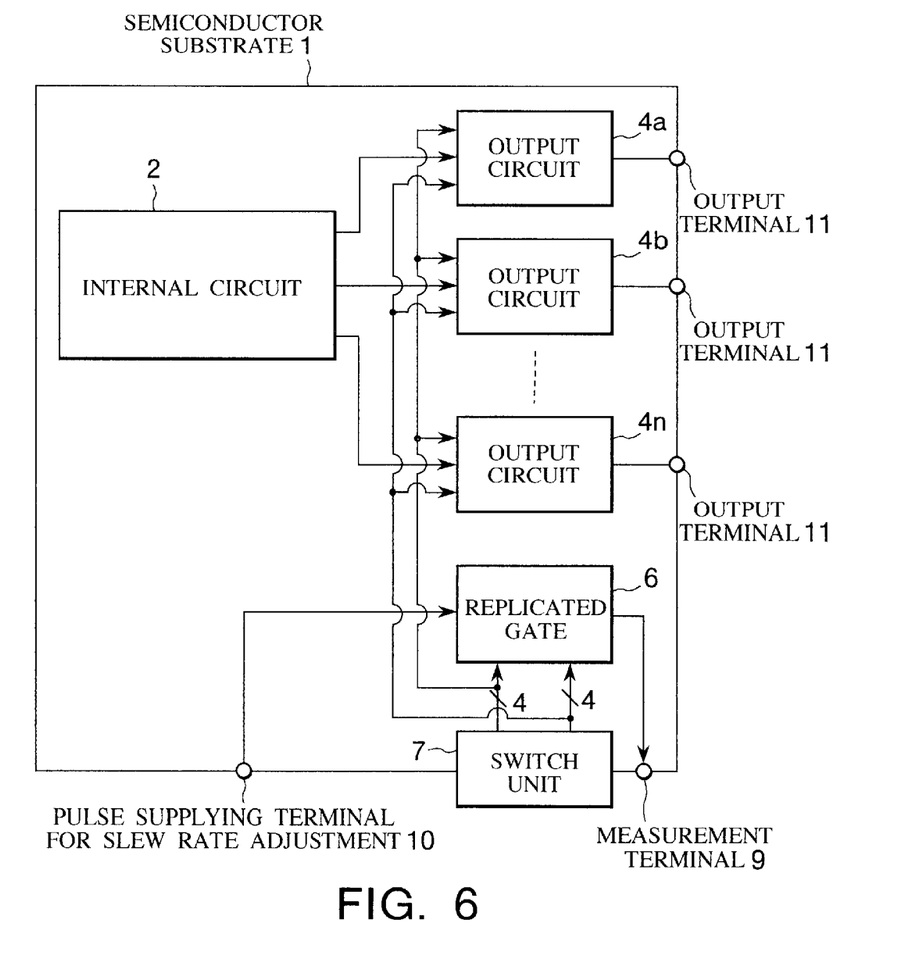
FIG. 6 is a block diagram showing the structure of a semiconductor circuit according to the second embodiment of the present invention.

FIG. 6 is a block diagram showing the structure of a semiconductor circuit according to the second embodiment of the present invention. The same component elements are denoted by the same reference numerals as those illustrated in FIG. 1. In this semiconductor circuit according to this embodiment, there is provided a pulse generation terminal 10 for slew rate adjustment for providing the replicated gate 6 with a pulse for slew rate adjustment, in place of the pulse generator 5 for slew rate adjustment shown in FIG. 1. Any other difference is not made in the semiconductor circuit illustrated in FIG. 6 from those shown in FIGS. 2 to 4.

Explanations will now be made to a method for adjusting a slew rate of output circuits included in the semiconductor circuit shown in FIG. 6.

The one who is in charge of slew rate adjustment provides the replicated gate 6 with a pulse for slew rate adjustment through the pulse generation terminal 9 for slew rate adjustment. Then, the slew rate of the replicated gate 6 is measured using a wave-form measurement unit, such as an oscilloscope, etc. through the measurement terminal 9. Then, it is determined whether the resultant measurement satisfies the characteristics of the slew rate shown in FIG. 5.

In the case where the resultant measurement does not satisfy the characteristics, the one who is in charge of slew rate adjustment operates the operational switches 110 to 113 and 120 to 123. Particularly, until the slew rate at the measurement terminal 9 satisfies the characteristics, an operation, for setting the voltage level of a voltage of the signal lines connected to their corresponding operational switches from a high to low level and vice versa, is repeated. In the case where the resultant measurement satisfies the characteristics after the operation for setting the voltage level, the slew rate of the replicated gate 6 is completely set. At this time, signals for setting the same resistance value as that of the replicated gate 6 are supplied both to the resistance setting units 100 and 101 in each of the output circuits 4a, 4b, . . . , 4n . Hence, the slew rate of each of the output circuits 4a, 4b, . . . , 4n is adjusted as to be the same as the slew rate of the replicated gate 6.

According to the second embodiment, a pulse for slew rate adjustment is supplied to the replicated gate 6 through the pulse generation terminal 10 for slew rate adjustment. Then, the slew rate at the measurement terminal 9 is so adjusted as to be a predetermined value, upon operation of the operational switches 110 to 113 and 120 to 123. Then, the slew rate of the replicated gate 6 is set based on digital signals generated by operating the operational switches 110 to 113 and 120 to 123. The slew rate of the output circuits 4a, 4b, . . . , 4n is so adjusted as to be the same as that of the replicated gate 6. According to the second embodiment, the same effect can be accomplished as that of the first embodiment. Because the pulse generator 5 for slew rate adjustment is not arranged, there is no need to prepare wiring or the like for connecting the pulse generator 5 for slew rate adjustment and the clock generator 3 with the replicated gate 6. In addition, if the clock generator 3 is not necessary in the internal circuit 2, there is no need to arranged the clock generator 3 itself. Only the replicated gate 6 and the switch unit 7 are necessarily added into the semiconductor circuit.

Third Embodiment

One of the features of the third embodiment of the present invention is that the slew rate of the output circuits is automatically adjusted.

Figure 7:
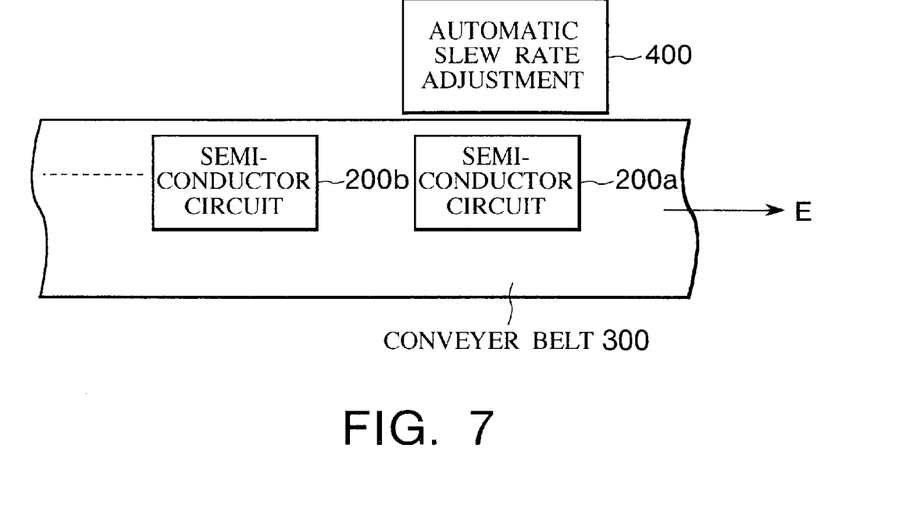
FIG. 7 is an exemplary diagram for explaining an automatic slew rate adjustment line for automatically adjusting a slew rate of a replicated gate in semiconductor circuits.

FIG. 7 is an exemplary top view of an automatic slew-rate adjustment line for automatically adjusting a slew rate of an output circuit in semiconductor circuits. A conveyer belt 300, on which semiconductor circuits 200a, 200b, . . . are placed at predetermined intervals, is movable by a non-illustrative belt movement controlling mechanism. An automatic slew-rate adjustment apparatus 400 as will be explained later is arranged adjacent to one side of the conveyer belt 300. The belt movement controlling mechanism controls the conveyer belt 300 to move in a direction represented with a reference mark E. During this control, when a terminal for slew rate adjustment included in each of the conveyed semiconductor circuits 200a, 200b, . . . is in electrically contact with a corresponding part of the automatic slew-rate adjustment apparatus 400, the belt movement controlling mechanism temporarily discontinues the controlling of the movement of the conveyer belt 300. After a predetermined period, the belt movement controlling mechanism again controls the conveyer belt 300 to move in the E direction. By doing so, the slew rate of the output circuit in each of the semiconductor circuits 200a, 200b, . . ., can automatically be adjusted by the automatic slew-rate adjustment apparatus 400.

Figure 9:
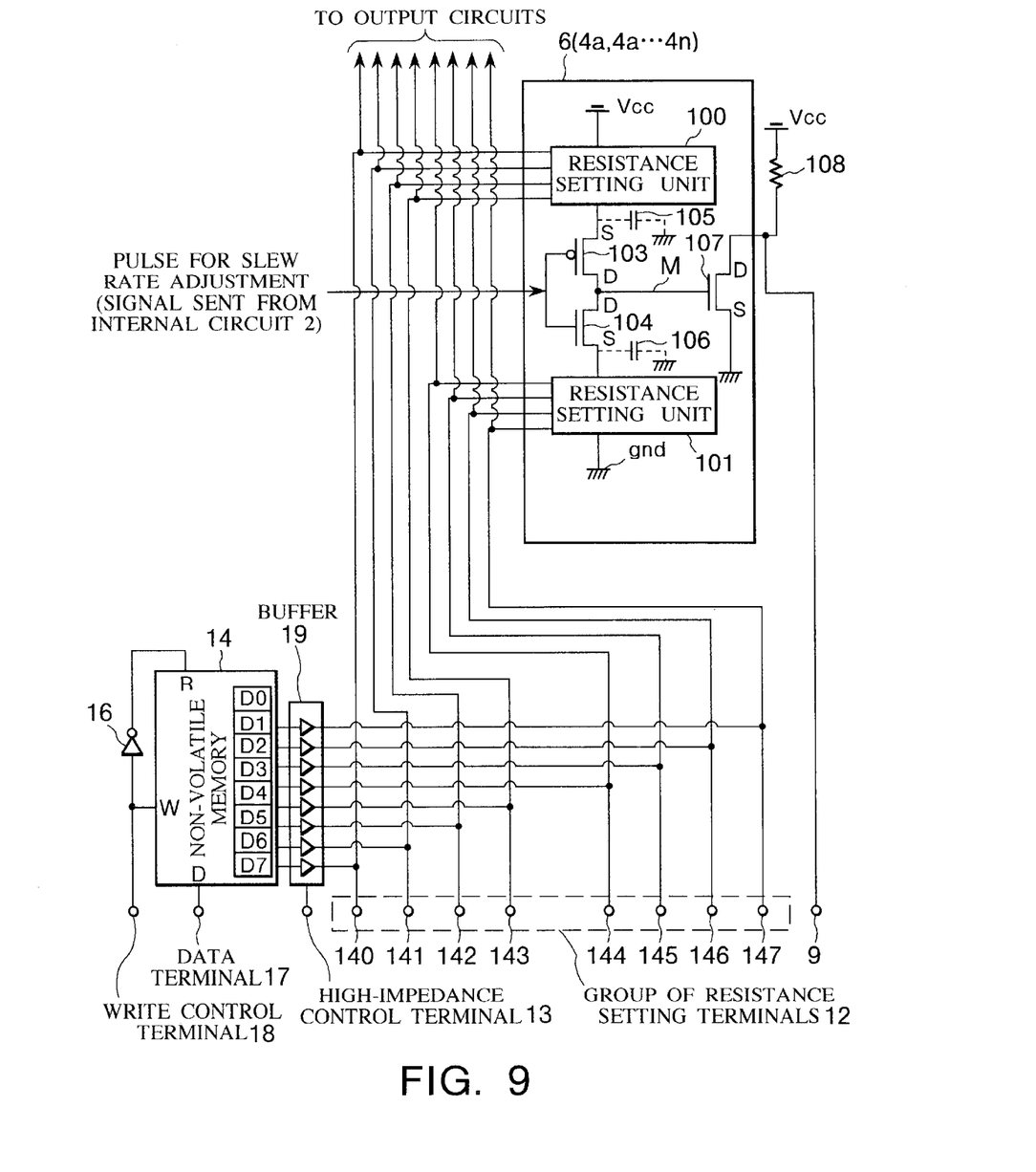
FIG. 9 is a circuitry diagram showing the structure of a replicated gate and its peripheral sections.

FIG. 9 is a circuitry diagram showing the structure of a replicated gate and its peripheral sections which are included in the semiconductor circuit. In this embodiment as well, the replicated gate 6 has the same structure as that of the output circuits 4a, 4b, . . . , 4n, and the replicated gate 6 and the output circuits 4a, 4b, . . . , 4n are formed on the same semiconductor substrate 1. In the circuit shown in FIG. 9, there are provided a group of resistance setting terminals 12 including terminals 140 to 147 which are connected to either one of the resistance setting units 100 and 101, respectively via signal lines, in place of the switch unit 7 included in the circuit shown in FIG. 2. Digital signals can be transmitted to the signal lines through the group of resistance setting terminals 12. In addition, a non-volatile memory 14 including a ROM, etc. and a buffer 19 prepared for buffering output data from the non-volatile memory 14 are added into the semiconductor circuit. This buffer 19 is in a high-impedance mode when a low-level signal is supplied thereto via a high-impedance control terminal 13, and is disconnected from corresponding signal lines (normally, the buffer 19 is reserved for buffering data when a high-level signal is supplied thereto).

Normally, a low-level signal is applied to a write control terminal 18, and a high-level signal is applied to a read terminal (R: active high) of the non-volatile memory 14 through an inverter 16. Then, digital signals stored in predetermined areas (D0 to D7) of the non-volatile memory 14 are supplied respectively to the signal lines through the buffer 19 (an appropriate voltage is applied to a non-illustrative address terminal, etc.). If a high-level signal is input to a write terminal (W: active high) of the non-volatile memory 14 through the write control terminal 18, digital signals transmitted through a data terminal 17 are stored in the predetermined areas (D0 to D7) of the memory 14. The inverter 16 intervenes between the read terminal (R) and the write terminal (W), thus while one of them is in operation, the other one is not.

Accordingly, when to set the slew rate of the replicated gate 6, a low-level signal is supplied to the buffer 19 through the high-impedance control terminal 13, and the buffer 19 is disconnected from the signal lines. The slew-rate adjustment apparatus 400 determines one or digital signals for obtaining a predetermined slew rate of the replicated gate 6, of a set of digital signals (to be applied to the group of resistance setting terminals 12) which is uniquely set according to a predetermined pattern. In the state where the buffer 19 is disconnected from the signal lines, an operation for writing the digital data to the non-volatile memory 14 is carried out. During this operation, a high-level signal is supplied to the write control terminal 18, and the digital signals are supplied to the non-volatile memory 14 through the data terminal 17 so as to be stored in the respective areas (D0 to D7). Sending of a high-level signal to the write control terminal 18 is terminated, and sending of digital signals to the non-volatile memory 14 through the high-impedance terminal 13 is terminated. Further, the buffer 19 is not disconnected from the signal lines any more, i.e., the buffer 19 is connected to the signal lines, thereby the digital signals stored in the non-volatile memory 14 are sent to the respective signal lines.

Figure 8:
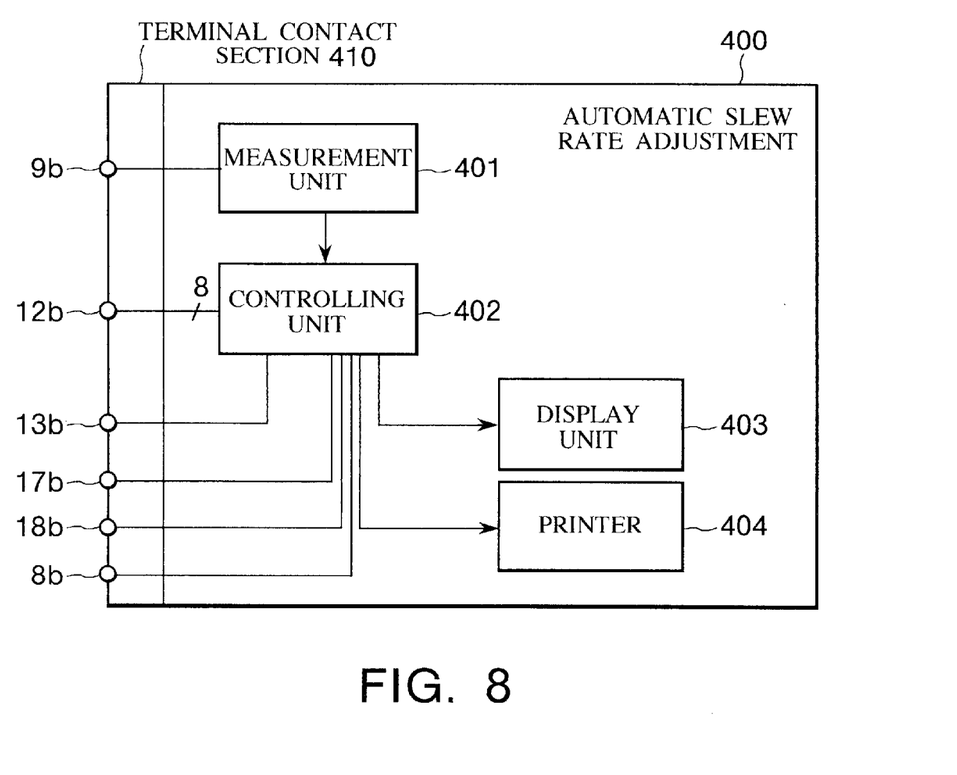
FIG. 8 is a block diagram showing the structure of an automatic slew rate adjustment apparatus according to the third embodiment of the present invention.

FIG. 8 is a block diagram showing the structure of the automatic slew-rate adjustment apparatus 400. This slew-rate adjustment apparatus 400 includes a terminal contact unit 410 having terminals which are electrically in contact with a predetermined one of the semiconductor circuits 200a, 200b, . . . , a measurement (observe) unit 401, a controlling unit 402, a display unit 403, and a printer 404. The terminal contact section 410 has a terminal 9b to be in contact with the measurement terminal 9, a terminal 12b (note that only one terminal 12b is shown in FIG. 8) to be in contact with a corresponding one of resistance setting terminals 12, a terminal 13b to be in contact with the high-impedance control terminal 13, a terminal 17b to be in contact with the data terminal 17, a terminal 18b to be in contact with the write control terminal 18, and a terminal 18b to be in contact with the mode control terminal 8. The automatic slew-rate adjustment apparatus 400 has the above structure, so that automatic slew-rate adjustment is accomplished with the semiconductor circuit of the first embodiment some parts of which are replaced with corresponding parts of the semiconductor circuit shown in FIG. 9.

Figure 10:
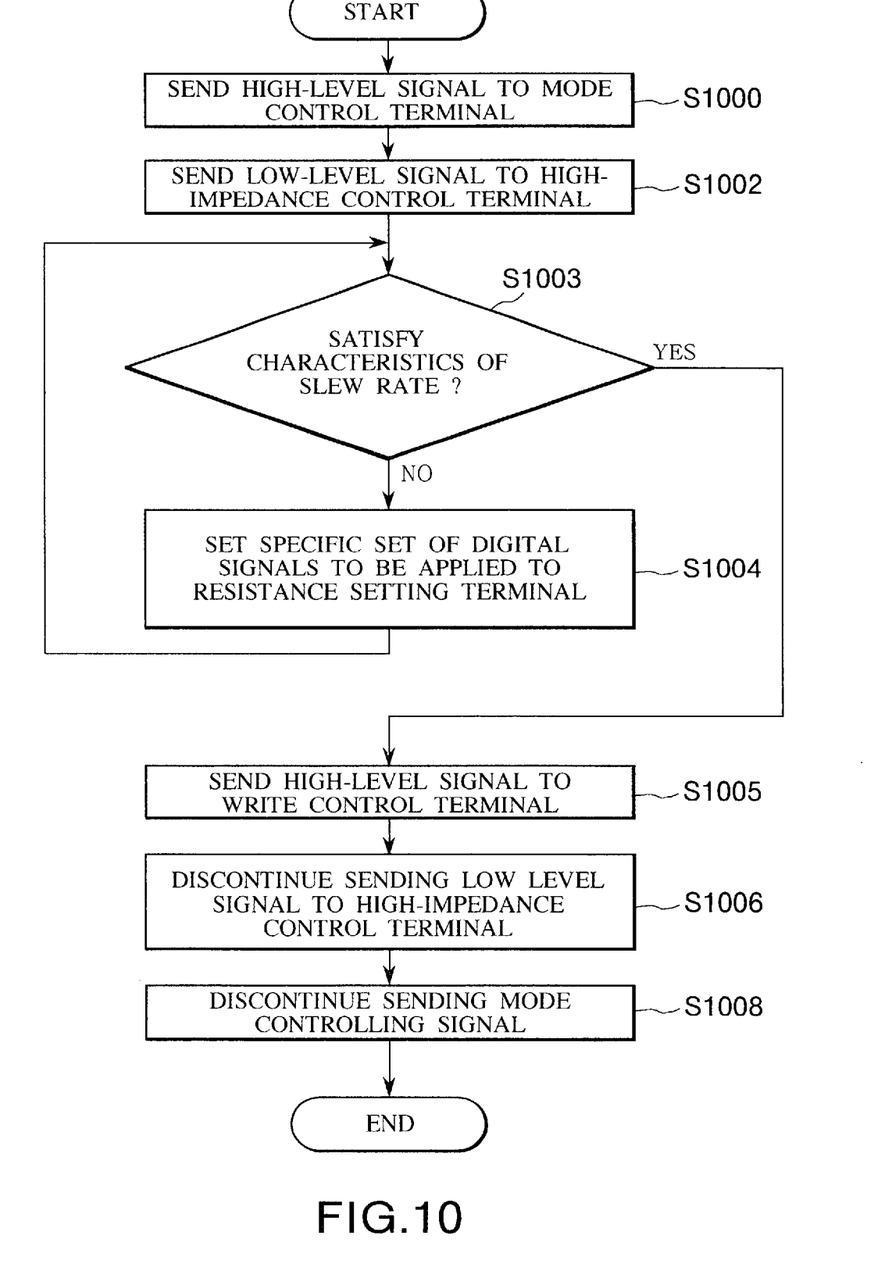
FIG. 10 is a flowchart for explaining operations of the adjustment apparatus according to the third embodiment.

Operations of the automatic slew-rate adjustment apparatus 400 will now be explained with reference to the flowchart, etc. of FIG. 10. The semiconductor circuit 200a becomes a target circuit for automatic slew-rate adjustment upon temporary discontinuation of the movement of the conveyer belt 300. In this case, the terminals 9b, 12b, 13b, 17b, 18b and 8b of the terminal contact section 410 are in contact with the measurement terminal 9, one corresponding resistance setting terminal 12, the high-impedance control terminal 13, the data terminal 17, the write control terminal 18, and the mode control terminal 8, respectively. The controlling unit 402 supplies the mode control terminal 8 with a high-level mode controlling signal via the terminal 8b (Step S1000), and supplies the high-impedance control terminal 13 with a low-level mode controlling signal via the terminal 13b (Step S1002). As a result of this, the pulse generator 5 for slew-rate adjustment in a slew-rate adjustment mode supplies the replicated gate 6 with a pulse for slew-rate adjustment, and the non-volatile memory 14 is disconnected from the signal lines.

After this, the slew rate of the replicated gate 6 is measured by the measurement unit 401 through the terminal 9b. When the controlling unit 402 determines that the resultant measurement satisfies the characteristics of slew rate shown in FIG. 5 (Yes in Step S1003), the flow advances to Step S1005. On the other hand, when determined that resultant measurement does not satisfy the characteristics (No in Step S1003), the slew rate of the replicated gate 6 is repeatedly measured while applying a unique set of digital signals to the terminal 12b according to a predetermined signal pattern, until the resultant measurement satisfies the characteristics, thereby determining a specific set of digital signals for satisfying the characteristics (Steps S1003, 1004). According to the predetermined signal pattern, unique sets of digital signals to be respectively applied to the terminals 140 to 147 may include the bit patterns of "00001111", "10000111", "11000011", and "11100001".

The controlling section 402 supplies the write control terminal 18 with a high-level signal through the terminal 18b, so that the non-volatile memory 14 is enabled to write data. Then, the controlling section 402 sends the determined set of digital signals to the non-volatile memory 14 from the data terminal 17 through the terminal 17b (Step S1005). As a result of this, the determined set of digital signals are stored in the predetermined areas of the non-volatile memory 14 in a non-volatile manner. After the digital signals are sent to the semiconductor circuit 200a, sending of a high-level signal to the write control terminal 18 is terminated. The controlling section 402 discontinues sending a low-level signal to the high-impedance control terminal 13 through the terminal 13b (Step S1006). The controlling section 402 discontinues sending a mode controlling signal to the mode control terminal 8 through the terminal 8b (Step S1008). As a result, the buffer 19 is not in a high-impedance state any more, and data stored in the predetermined areas of the non-volatile memory 14 is read out and sent to the corresponding signal lines. Further, the pulse generator 5 for slew rate adjustment discontinues supplying the replicated gate 6 with a pulse for slew rate adjustment. Hence, the slew rate of the output circuits 4a, 4b, . . . , 4n is so automatically adjusted as to be the same as the slew rate set for the replicated gate 6.

According to this embodiment, while the slew rate of the replicated gate 6 is measured through the terminal 9b which is to be in contact with the measurement terminal 9, a unique set of digital signals, which are set according to a predetermined signal pattern, are sent from the group of resistance setting terminals 12. Further, digital signals representing a desired value, i.e., the slew rate of the replicated gate 6, are stored in the non-volatile memory 14. Based on those stored digital signals, the slew rate of the output circuits is adjusted and set to a predetermined value. This realizes a semiconductor circuit having a replicated gate whose slew rate can automatically be adjusted, and an apparatus which automatically adjusts the slew rate of the replicated gate included in the semiconductor circuit. Likewise the first embodiment, according to this embodiment, no complicated technique for manufacturing a circuit is necessary. Having set the slew rate of the replicated gate 6, the slew rate of the output circuits can be adjusted with high accuracy in the structure where the parasitic capacitance has an effect on the slew rate.

The controlling section 402 measures using a built-in timer the time periods during which the respective procedures of Steps S1003 and S1004 are completely carried out. Further, the controlling section 402 obtains the mean value of the measured time periods and the total time period during which the slew rate of the replicated gate is adjusted per day. The controlling section 402 controls the display unit 403 to display the obtained values, and controls the printer 404 to print the displayed values, thereby to facilitate the process for managing the semiconductor manufacturing line.

Fourth Embodiment

Figure 11:
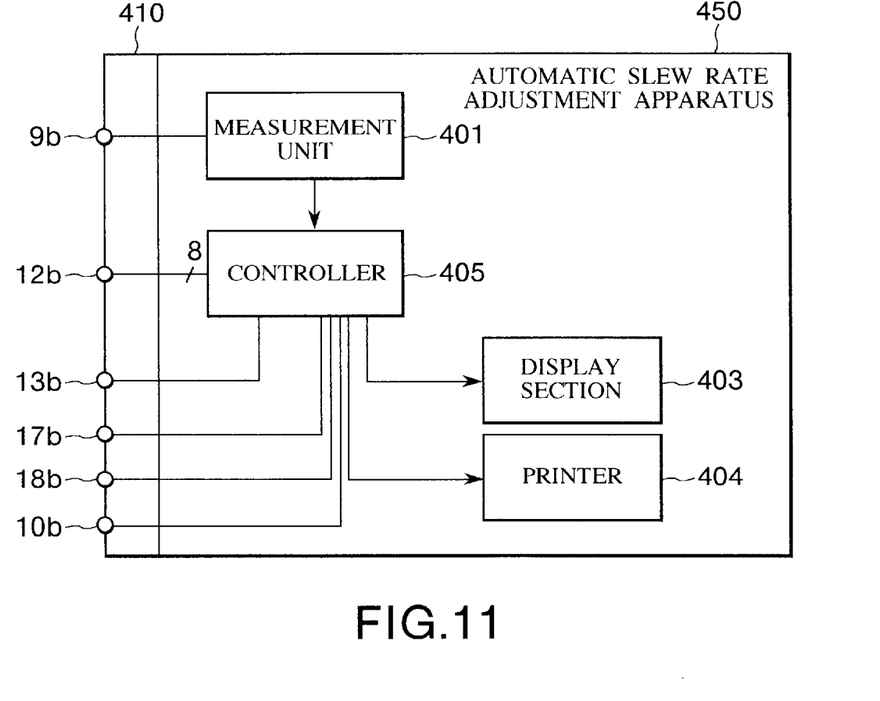
FIG. 11 is a block diagram showing an automatic slew rate adjustment apparatus according to the fourth embodiment of the present invention.
Figure 12A:
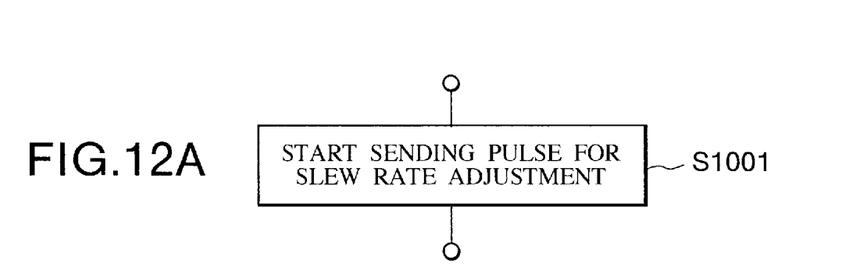
FIGS. 12A and 12B are diagrams showing operational procedures of the adjustment apparatus according to the fourth embodiment.
Figure 12B:
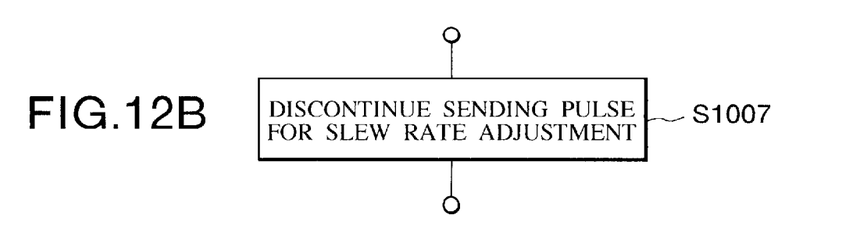

One of the features of the fourth embodiment is that automatic slew rate adjustment is performed in the semiconductor circuit shown in FIG. 6 some parts of which are replaced with corresponding parts of the semiconductor circuit shown in FIG. 9. FIG. 11 is a block diagram showing the structure of an automatic slew-rate adjustment apparatus 450 according to the fourth embodiment of the present invention. The same component elements are denoted by the same reference numerals as those illustrated in FIG. 8. The automatic slew-rate adjustment apparatus 450 shown in FIG. 11 includes a terminal 10b to be intact with the pulse generation terminal 10 for slew rate adjustment, in place of the terminal 8b of the automatic slew rate adjustment apparatus 400 illustrated in FIG. 8. In this embodiment, there are provided a procedure of Step S1001 for sending a pulse for slew-rate adjustment through the terminal 10b, as shown in FIG. 12A, and a procedure of Step S1007 for discontinuing sending a pulse for slew-rate adjustment, as shown in FIG. 12B, so that the slew rate of the replicated gate is automatically adjusted.

According to this embodiment as well, there are realized a semiconductor circuit, wherein the slew rate of its replicated gate is automatically adjusted, and an apparatus, which automatically adjusts the slew rate of the replicated gate included in the semiconductor circuit. Likewise the second embodiment, no complicated technique for manufacturing the semiconductor circuit is required. Having set the slew rate of the replicated gate 6, the slew rate of the output circuits can be adjusted with high accuracy even if the parasitic capacitance has an effect on the slew rate. According to the fourth embodiment, the controlling unit 405 carries out a process for taking statistics of time periods required for the slew-rate adjustment, controls the display unit 403 to display the calculated values, and controls the printer 404 to print the obtained values, thereby to facilitate the process of managing the semiconductor manufacturing line process.

Various embodiments and changes may be made thereonto without departing from the broad spirit and scope of the invention. For example, the gate width of the transistor of the circuit forming the resistance setting units 100 and 101 may be changed, and the resistance values set by the resistance setting units 100 and 101 may be multiplied by their associated weight. The semiconductor circuit of the present invention may be a data transmission circuit, a bus driver, or the like. However, the present invention is not limited to the above, and any other suitable devices can be employed.

The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-295755 filed on Oct. 18, 1999, and including specification, claims, drawings and summary. The disclosure of the above Japanese Patent Application is incorporated herein by reference in its entirety.

What is claimed is:

1. A semiconductor circuit including an output circuit whose slew rate can be adjusted and which outputs a signal, sent from an internal circuit, said semiconductor circuit comprising:

at least one output circuit which outputs a signal sent from an internal circuit externally, and whose slew rate is adjusted in response to a setting signal;

a replicated output circuit which has a same structure as a structure of the output circuit, receives a pulse signal and outputs a pulse signal, and whose slew rate is adjusted in response to the setting signal;

a pulse signal supplier for slew rate adjustment which supplies said replicated output circuit with the pulse signal for slew rate adjustment; and a setting signal supplier which supplies the setting signal for setting a slew rate of said output circuit and said replicated output circuit, and wherein the slew rate of said replicated output circuit is set based on the setting signal, and the slew rate of the output circuit is adjusted to be substantially same as the slew rate of said replicated output circuit.

2. The semiconductor circuit according to claim 1, wherein
said pulse signal suppler comprises a pulse generator which generate the pulse signal and supplies the pulse signal to the replicated output circuit or a pulse supplying terminal through which the pulse signal is supplied to the replicated output circuit.

3. The semiconductor circuit according to claim 1, wherein:
the slew rate of said replicated output circuit can be set by varying resistance of said replicated output circuit based on received setting signals; and
said setting signal supplier supplies the setting signal comprised of digital signals generated upon operations of switches.

4. A method for adjusting the slew rate of the output circuit included in the semiconductor circuit according to claim 1, said method comprising:
supplying to said replicated output circuit from said pulse signal supplier with a pulse signal having a predetermined frequency;
changing the setting signal from said setting signal supplier while observing an output signal of said replicated output circuit.

5. A circuit comprising:
an output circuit whose slew rate can be adjusted based on a setting signal and which outputs a signal from an internal circuit to an external circuit;
a replicated gate which has a same structure as a structure of the output circuit and whose slew rate can be adjusted based on a setting signal;
a pulse signal supplier which supplies said replicated gate with a pulse signal;
a digital signal supplier which supplies a set of digital signals set; and
a memory which stores in a non-volatile manner the setting signal by which an adequate slew rate of said replicated gate is obtained, said memory outputting the stored setting signal to said output circuit.

6. An automatic slew-rate adjustment apparatus which automatically adjusts the slew rate of the output circuit included in the circuit according to claim 5, said apparatus comprising:
an observing device which observes a signal from said replicated gate; and
a controlling device which controls adjustment of the slew rate of the output circuit, and
wherein said controlling device
controls said pulse signal supplier to supply said replicated gate with a signal,
controls said digital signal supplier to switchingly supply the digital signal in accordance with a predetermined pattern, and determines one or more digital signals when said observing device detects a desired slew rate of said replicated gate, and
writes the determined one or more digital signals in said memory.

7. A semiconductor circuit including an output circuit whose slew rate can be adjusted and which outputs a signal, from an internal circuit, externally from a semiconductor substrate, said semiconductor circuit comprising:
a replicated gate which has a same structure as a structure of the output circuit and is arranged on a semiconductor substrate on which the output circuit is arranged;
a measurement terminal through which a signal from said replicated gate is output;
a pulse supplier for slew rate adjustment which supplies said replicated gate with a pulse signal for slew rate adjustment;
a digital signal supplier which supplies a set of digital signals which are set according to a predetermined pattern, in order to set the slew rate of said replicated gate; and
a memory which stores in a non-volatile manner one or more digital signals for setting the slew rate of said replicated gate to a desired value, of the set of digital signals set according to a predetermined pattern.

8. An automatic slew-rate adjustment apparatus which automatically adjusts the slew rate of the output circuit included in the semiconductor circuit according to claim 7, said apparatus comprising:
an observing device which observes a signal from said measurement terminal; and
a controlling device which controls adjustment of the slew rate of said replicated gate, and
wherein said controlling device
controls said pulse supplier to supply said replicated gate with a pulse signal,
controls said digital signal supplier to switchingly supply digital signals in accordance with a predetermined pattern, and determines one or more digital signals by which the observing device observes the signal from said replicated gate satisfies predetermined characteristics, and
writes the determined digital signals in said memory.

9. An automatic slew-rate adjustment apparatus which automatically adjusts the slew rate of the output circuit included in the semiconductor circuit according to claim 6, wherein said controlling device carries out a process for taking statistics of time periods required for automatically adjusting the slew rate of said replicated gate, and controls an output stage to output a result of the process.

10. An automatic slew-rate adjustment apparatus which automatically adjusts the slew rate of the output circuit included in the semiconductor circuit according to claim 8, wherein said controlling device carries out a process for taking statistics of time periods required for automatically adjusting the slew rate of said replicated gate, and controls an output stage to output a result of the process.

11. A circuit comprising:
an output circuit which outputs a supplied signal, and whose slew rate can be adjusted in response to a setting signal;
a replicated output circuit which receives a pulse signal and outputs a pulse signal and whose slew rate can be adjusted in response to the setting signal;
a pulse signal supplier which supplies said replicated output circuit with a pulse signal; and
a setting signal supplier which supplies the setting signal to said output circuit and said replicated output circuit.

12. A method of adjusting the slew rate of the output circuit defined in claim 11, wherein,
supplying a pulse signal with a desired frequency to the replicated output circuit from said pulse signal supplier; and
supplying a setting signal to said replicated output circuit while observing the output signal of said replicated output circuit, and
supplying to said output circuit with a setting signal which is output when it is observed that the output signal of said replicated output circuit satisfies a predetermined characteristics.

13. The method of claim 12, wherein the setting signals supplied to said output circuit and said replicated output circuit are substantially same as each other.

14. The method of claim 12, wherein the setting signal supplied to said replicated output circuit, which is output when it is observed that the output signal of said replicated output circuit satisfies a predetermined characteristics, is stored in a memory, the stored setting signal is supplied to said output circuit.

* * * * *